US012294366B2

(12) United States Patent
Chang

(10) Patent No.: US 12,294,366 B2
(45) Date of Patent: May 6, 2025

(54) LEVEL SHIFTER WITH INSIDE SELF-PROTECTION HIGH BIAS GENERATOR

(71) Applicant: Taiwan Semiconductor Manufacturing Company, Ltd., Hsinchu (TW)

(72) Inventor: Yen-An Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 49 days.

(21) Appl. No.: 18/319,835

(22) Filed: May 18, 2023

(65) Prior Publication Data

US 2024/0388293 A1    Nov. 21, 2024

(51) Int. Cl.
*H03K 19/0185*    (2006.01)
*H03K 3/356*    (2006.01)
*H03K 19/003*    (2006.01)

(52) U.S. Cl.
CPC ........... *H03K 19/018521* (2013.01); *H03K 3/356113* (2013.01); *H03K 3/356182* (2013.01); *H03K 19/00315* (2013.01)

(58) Field of Classification Search
CPC ..... H03K 19/018521; H03K 3/356113; H03K 3/356182; H03K 19/00315
See application file for complete search history.

(56) References Cited

U.S. PATENT DOCUMENTS

| 5,737,267 | A | * | 4/1998 | Proebsting | ............... G11C 8/08 |
| | | | | | 365/189.011 |
| 10,812,080 | B2 | * | 10/2020 | Pigott | .............. H03K 3/356182 |
| 10,911,047 | B1 | * | 2/2021 | Shetty | .............. H03K 3/356182 |
| 2018/0115314 | A1 | | 4/2018 | Koudate | |

FOREIGN PATENT DOCUMENTS

TW    200731667 A * 8/2007

OTHER PUBLICATIONS

Office Action issued in connection with Taiwan Appl. No. 112135588 dated Jun. 11, 2024.

* cited by examiner

*Primary Examiner* — Metasebia T Retebo
(74) *Attorney, Agent, or Firm* — FOLEY & LARDNER LLP

(57) ABSTRACT

A semiconductor device and a method of operating the semiconductor device are disclosed. In one aspect, the semiconductor device includes a level shifting circuit configured to generate an output voltage in a second voltage domain corresponding to an input signal in a first voltage domain. The level shifting circuit includes a thick-oxide transistor and a thin-oxide transistor. The semiconductor device includes a bias generating circuit operatively coupled to the level shifting circuit and configured to generate a bias voltage substantially higher than a voltage of the input signal, and provide the bias voltage to a gate of the thick-oxide transistor, causing the level shifting circuit to generate the output voltage.

19 Claims, 6 Drawing Sheets

LEVEL SHIFTER WITH INSIDE SELF-PROTECTION HIGH BIAS GENERATOR

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
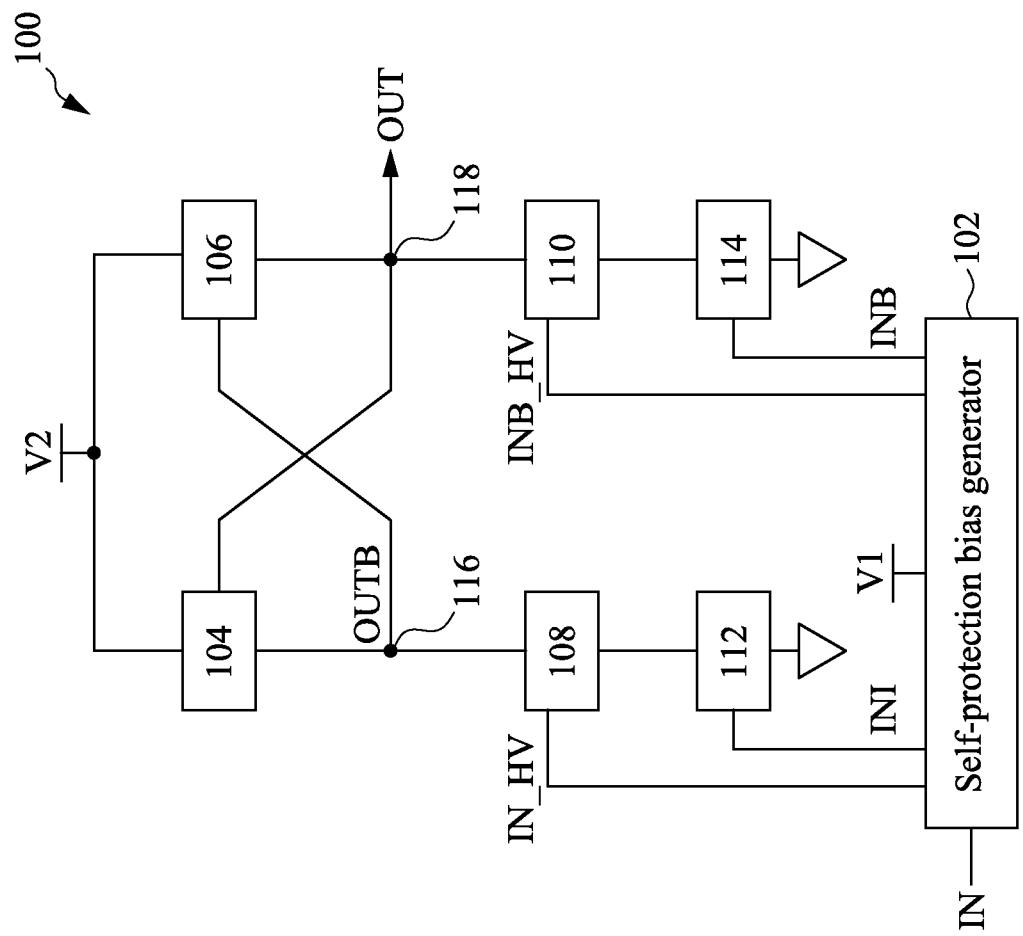
FIG. 1 illustrates a schematic block diagram of a level shifter with a self-protection high bias generator circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Level shifting circuits are electronic circuits that generate an output signal that is proportional to an input signal. Such circuits may be utilized, for example, to drive components or circuits that may operate at different voltage levels. In typical level shifting circuits, gates of field effect transistors or other types of transistors can be driven in part by an input signal, which causes the transistor to switch a secondary voltage source on or off to generate an output signal. The secondary voltage source may be greater than or less than the voltage source used to drive the input signal. However, due to reductions in minimum feature size, it may be challenging to drive the gates of transistors (e.g., thick-oxide transistors) that are suitable for controlling higher voltages to produce a reliable output signal.

The present disclosure provides various embodiments of a level shifting system that includes a self-protection bias generator circuit, which is capable of generating an amplified signal to drive protection transistors integrated in the level shifter circuit. The protection transistors may be thick-oxide devices that can protect other thin-oxide pull-down transistors that may be included in typical level shifting circuits. Protecting the thin-oxide transistors enables fabrication of level shifting circuits with desirable ratios of output voltage to input voltage, and prevents instances of device failure or malfunctioning devices.

FIG. 1 illustrates a schematic block diagram of a level shifter 100 with a self-protection high bias generator circuit 102, in accordance with some embodiments. A level shifter is a type of circuit that can be utilized to convert a signal from a first voltage level to a second voltage level. In general, a level shifter receives an input signal at the first voltage level and generates an output voltage having the same or opposite logical polarity at the second voltage level. In some embodiments, a level shifter can be included as a part of a larger IC device which comprises circuitry other than the memory device for other functionalities.

The level shifter 100 includes the pull up device 104 and the pull up device 106. Each of the pull up device 104 and the pull up device 106 can be or include transistors that are electrically coupled to the supply voltage source V2. As shown, different terminals of the pull up device 104 and the pull up device 106 can be coupled to the OUTB node 116 and the OUT node 118. Further details of the pull up device 104 and the pull up device 106 are described in connection with FIGS. 4 and 5. In an embodiment, the OUT node 118 can provide a level shifted output voltage (e.g., up to the supply voltage V2) to one or more other circuits or components of an integrated circuit. In an embodiment, the OUTB node 116 can provide a level shifted output voltage having an opposite logical polarity (e.g., an opposite logical state) up to the supply voltage V2.

The level shifter 100 includes a first protection device 108 and a first pull down device 112. Each of the first protection device 108 and the first pull down device 112 can be or include transistors. As shown, the protection device 108 is electrically coupled to the OUTB node 116 and the first pull down device 112. The first pull down device 112 is electrically coupled to the protection device 108 and a ground voltage. The voltage at the OUTB node 116 may be controlled in part by the first pull up device 104, the first protection device 108, and the first pull down device 112. The first protection device 108 and the first pull down device 112 can be connected in series. The second protection device 110 and the second pull down device 114 can be connected in series.

The level shifter 100 includes a second protection device 110 and a second pull down device 114. Each of the second protection device 110 and the second pull down device 114 can be or include transistors. As shown, the second protection device 110 is electrically coupled to the OUT node 118 and the second pull down device 114. The second pull down device 114 is electrically coupled to the protection device 110 and a ground voltage. The voltage at the OUT node 118 may be controlled in part by the second pull up device 106, the second protection device 110, and the second pull down device 114. In the level shifter 100, the first and second pull up devices 104 and 106 can be cross-coupled. As shown, at least one terminal (e.g., a gate terminal) of the first pull up device 104 is connected to the OUT node 118, and at least one terminal (e.g., a gate terminal) of the second pull up device 106 is connected to the OUTB node 116.

Each of the first protection device 108 and the second protection device 110 can be controlled, at least in part, by the self-protection bias generator circuit 102. The first protection device 108 and the second protection device 110 can be or include thick gate oxide transistors, which may be activated in response to a relatively higher gate voltage compared to other types of transistors described herein. In order to withstand the relatively high voltage without gate oxide breakdown, such transistors can be formed having a relatively thick gate oxide, such as, for example, greater than about 50 angstroms thick and relatively long channel lengths (e.g., about twice the length of thin-oxide transistors). Therefore, transistors described herein that are able to withstand relatively high voltages and have relatively thick gate oxide may be referred to herein as a "thick-oxide transistor" or "thick-oxide FET." The first protection device 108 and the second protection device 110 can be or include thick-oxide transistors.

Some logic transistors are an example of a second type of transistor that is designed to operate in a lower voltage environment, such as, for example, a 1.1-volt nominal environment. Because the voltages applied to these transistors are lower than the voltages applied to a thick-oxide transistor, the gate oxide of logic transistors does not need to be as thick compared to the gate oxide of a thick-oxide device. For example, the gate oxide thickness of a typical logic transistor may be about 10 to 12 angstroms and the channel length may be short (e.g., at a minimum specified lithographic dimension). Therefore, the second type of transistor, which is able to withstand relatively low voltages and has relatively thin gate oxide, may be referred to herein as a "thin-oxide transistor" or "thin-oxide FET." The first pull down device 112 and the second pull down device 114 can be or include thin-oxide transistors.

Because the first protection device 108 and the second protection device 110 are thick-oxide transistors, they may utilize a greater input voltage to turn on. In contrast, the thin-oxide transistors of the first pull down device 112 and the second pull down device 114 can be operated at a relatively lower voltage compared to the first protection device 108 and the second protection device 110. An additional bias voltage that is capable of driving the first protection device 108 and the second protection device 110 can be generated by the self-protection bias generator 102. Additionally, the self-protection bias generator 102 can generate signals that are capable of driving the thin-oxide transistors of the first pull down device 112 and the second pull down device 114.

The self-protection bias generator 102 can be connected to the supply voltage V1, which may have a voltage that is capable of driving the first pull down device 112 and the second pull down device 114, but not the first protection device 108 and the second protection device 110. The self-protection bias generator 102 can utilize the supply voltage V1, along with the input signal IN, to generate output voltage signals IN_HV and INB_HV, which are capable of driving the gates of the thick-oxide transistors of the first protection device 108 and the second protection device 110, respectively. The self-protection bias generator 102 further provides outputs INI and INB, corresponding the supply voltage V1, which are capable of driving the gates of the thin-oxide transistors of the first pull down device 112 and the second pull down device 114.

The self-protection bias generator 102 can generate the output voltage signals IN_HV and INB_HV using only the supply voltage V1 and the input signal IN, without requiring an additional bias voltage source (e.g., with a voltage greater than the supply voltage V1) that is capable of driving the first protection device 108 and the second protection device 110. This reduces overall power consumption compared to an implementation that utilizes an additional bias voltage source. Additionally, the self-protection bias generator 102 can utilize thin-oxide transistors at the input of the self-protection bias generator 102, enabling relatively low-voltage input operation. The self-protection bias generator 102 therefore increases the ratio of the output voltage at the OUT node 118 to the input voltage of the input signal IN, using only the relatively lower supply voltage V1. The use of the self-protection bias generator 102 provides compatibility with various logic processes without extra process-specific components, devices, or circuits to perform level shifting. Various embodiments of the circuit of the self-protection bias generator 102 are described in connection with FIGS. 4 and 5.

Figure 2:
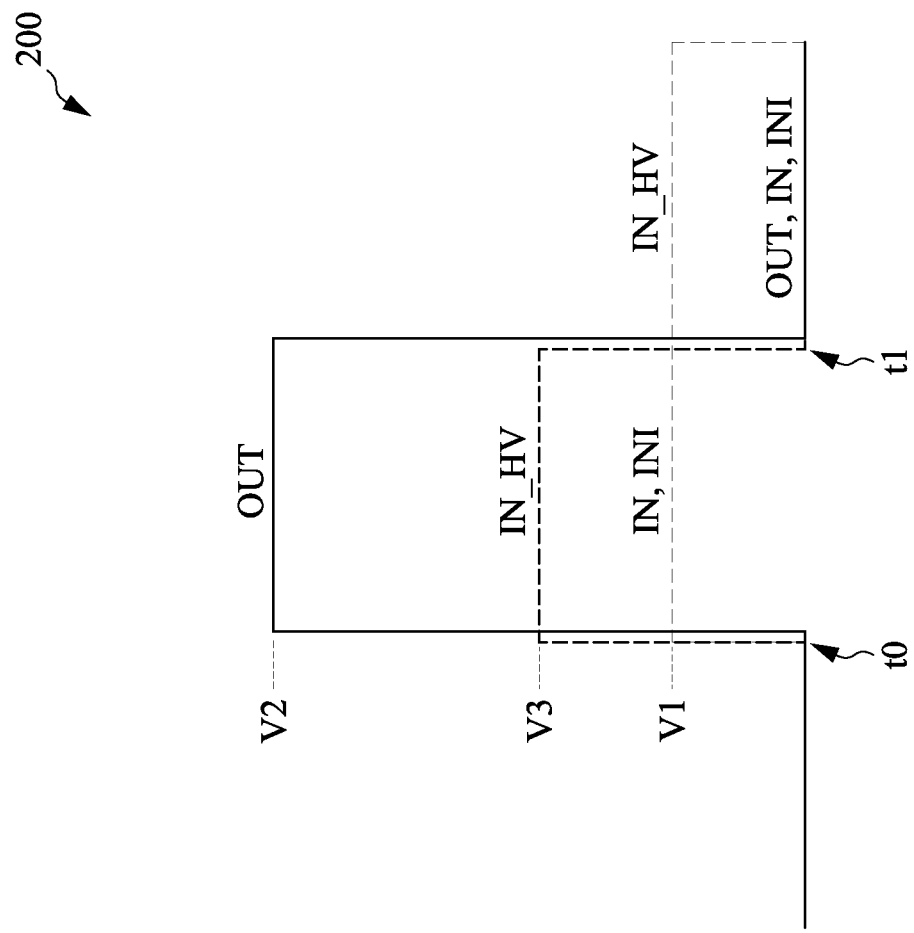
FIG. 2 illustrates waveforms of voltage signals of the circuit shown in FIG. 1 in response to a high input voltage signal, in accordance with some embodiments of the present disclosure.

The operation of the example level shifter 100 including the self-protection bias generator 102 shown in FIG. 1 is described in connection with the waveform diagram 200 of FIG. 2. FIG. 2 illustrates waveforms 200 of voltage signals of the circuit shown in FIG. 1 in response to the input signal IN being in a "logical high" (e.g., "logic 1") state. In this example operation, from time t0 to t1, the input signal IN is in a logical high state (e.g., equal to the supply voltage V1, as shown). When the input signal IN is in a logical high state, the self-protection bias generator 102 can generate the output signal INI, which drives the first pull down device 112 with a logical high voltage about equal to V1. Additionally, the self-protection bias generator 102 generates the output signal IN_HV, which drives the first protection device 108 with a bias voltage V3 that is greater than V1 and less than the voltage of V2. The greater bias voltage enables the first protection device 108 to be turned on, even though the first protection device 108 includes a thick-oxide transistor. Although not shown here for visual clarity, the signal INB is driven to logical low (e.g., a ground voltage, a "logical 0") between time t0 and t1. In an embodiment, the voltage signal INB_HV may be driven to a ground voltage or a voltage that is less than V3 (e.g., less than a threshold voltage of the second protection device 110). The supply voltage V1 and the supply voltage V2 may each correspond to first and second voltage domains, respectively. Voltage domains correspond to different sections or areas of a circuit that operate different voltage levels, and may be utilized to ensure that different parts of the circuit are operating at the correct voltage level to minimize power consumption, prevent damage, and improve overall performance.

When the output signal INI is generated at a logical high voltage, and the output signal IN_HV is generated at the voltage V3, both of the first protection device 108 and the first pull down device 112 are turned on. Additionally, when the output signals INB and INB_HV are set to logical low and less than the voltage V3, respectively, both the second protection device 110 and the second pull down device 114 are turned off. When the first protection device 108 and the first pull down device 112 are turned on, the OUTB node 116 is pulled to about the ground voltage. This turns on the second pull up device 106. Because the second protection device 110 and the second pull down device 114 are turned off and not conducting, and the second pull up device 106 is turned on and conducting, a voltage about equal to V2 is generated at the OUT node 118 between about time t0 and t1, with a small time offset due to the time taken for the transistors in the level shifter 100 to change state.

When the input signal IN is turned to the logical low state after time t1, the self-protection bias generator 102 pulls the output signal INI to a logical low state (e.g., a ground voltage), and outputs the IN_HV signal at a voltage about equal to V1. When the output signal INI is in a logical low state and the IN_HV signal has a voltage about equal to V1, both the first protection device 108 and the first pull down device 112 are turned off. Further details of the voltage levels of the nodes in the level shifter 100 when the input signal IN is in the logical low state are described in connection with FIG. 3.

Figure 3:
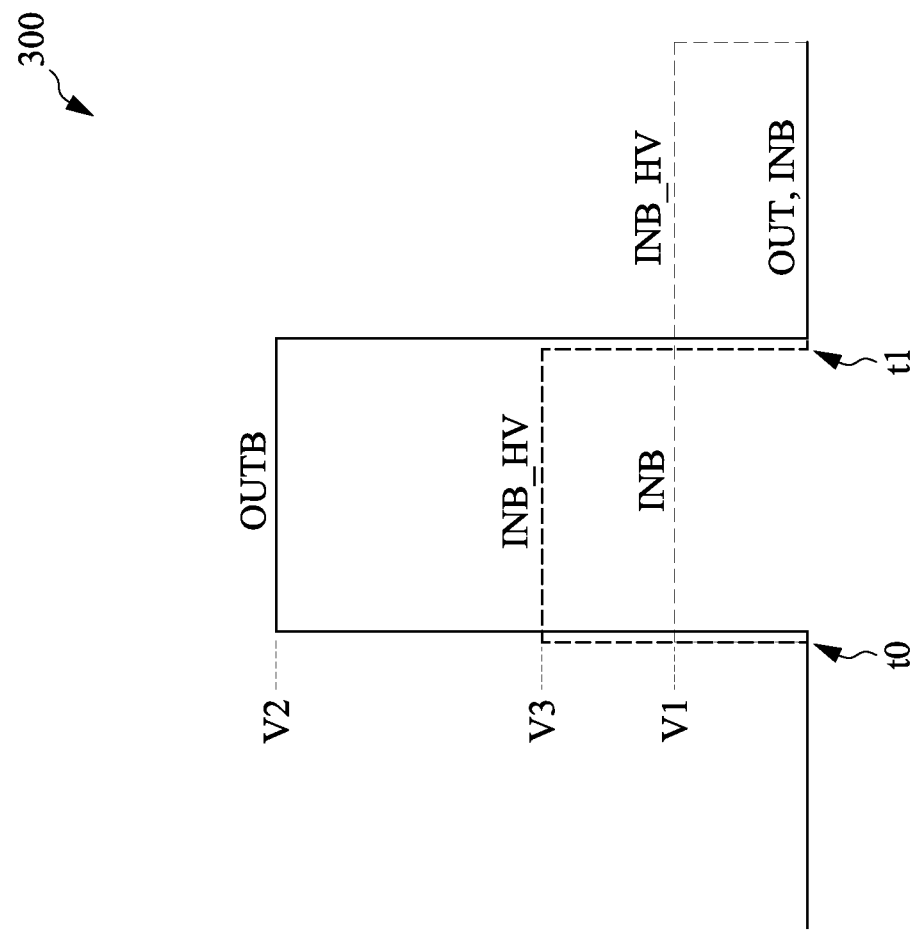
FIG. 3 illustrates waveforms of voltage signals of the circuit shown in FIG. 1 in response to a low input voltage signal, in accordance with some embodiments of the present disclosure.

In FIG. 3, illustrated are waveforms 300 of voltage signals of the level shifter 100 including the self-protection bias generator 102 shown in FIG. 1 when the input signal IN is in the logical low state. In this example operation, from time t0 to t1, the input signal IN (not shown in FIG. 3) is in a logical low state (e.g., equal to ground, etc.). When the input signal IN is in a logical low state, the self-protection bias generator 102 can generate the output signal INB, which drives the second pull down device 114 with a logical high voltage about equal to V1. Additionally, the self-protection bias generator 102 generates the output signal INB_HV, which drives the second protection device 110 with a bias voltage V3 that is greater than V1 and less than the voltage of V2, as shown. The greater bias voltage enables the second protection device 110 to be turned on, even though the first protection device 110 includes a thick-oxide transistor. Although not shown here for visual clarity, the signal INI is driven to logical low voltage (e.g., a ground voltage) between time t0 and t1. In addition, the voltage signal IN_HV may be driven to a ground voltage or a voltage that is less than V3 (e.g., less than a threshold voltage of the second protection device 110, about equal to V1, etc.), as shown in the waveform 200 after t1 in FIG. 2.

When the output signal INB is generated at a logical high voltage, and the output signal INB_HV is generated at the voltage V3, both of the second protection device 110 and the second pull down device 114 are turned on. Additionally, when the output signals INI and IN_HV are set to logical low and less than the voltage V3 (e.g., about voltage V1), respectively, both the first protection device 108 and the first pull down device 112 are turned off. When the second protection device 110 and the second pull down device 114 are turned on, the OUT node 118 is pulled to about the ground voltage. This turns on the first pull up device 104. Because the first protection device 108 and the first pull down device 112 are turned off and not conducting, and the first pull up device 104 is turned on and conducting, a voltage about equal to V2 is generated at the output OUTB node 116 between about t0 and t1, with a small time offset due to the time taken for the transistors in the level shifter 100 to change state.

When the input signal IN is turned to the logical high state after t1, the self-protection bias generator 102 pulls the output signal INB to a logical low state (e.g., a ground voltage), and outputs the INB_HV signal at a voltage about equal to V1. When the output signal INB is in a logical low state and the INB_HV signal has a voltage about equal to V1, both the second protection device 110 and the second pull down device 114 are turned off. Further details of the voltage levels of the nodes in the level shifter 100 when the input signal IN is in the logical high state are described in connection with FIG. 2.

Various embodiments of circuits that implement the level shifter 100 including the self-protection bias generator 102 are described in connection with the circuit diagrams 400 and 500 of FIGS. 4 and 5, respectively. The transistors described herein are shown to have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Furthermore, although each of the transistors M1-M10 of FIGS. 4 and M11-20 of FIG. 5 are shown as one transistor, embodiments are not limited thereto. For example, each of the transistors M1-M10 of FIGS. 4 and M11-20 of FIG. 5 may include more than one transistor ("sub-transistor") that are connected to one another in parallel. For example, in an embodiment, each of the sub-transistors of any transistor described herein can include respective gate, drain, and source terminals that are electrically coupled to the respective gate, drain, and source terminals of other sub-transistors in parallel.

Figure 4:
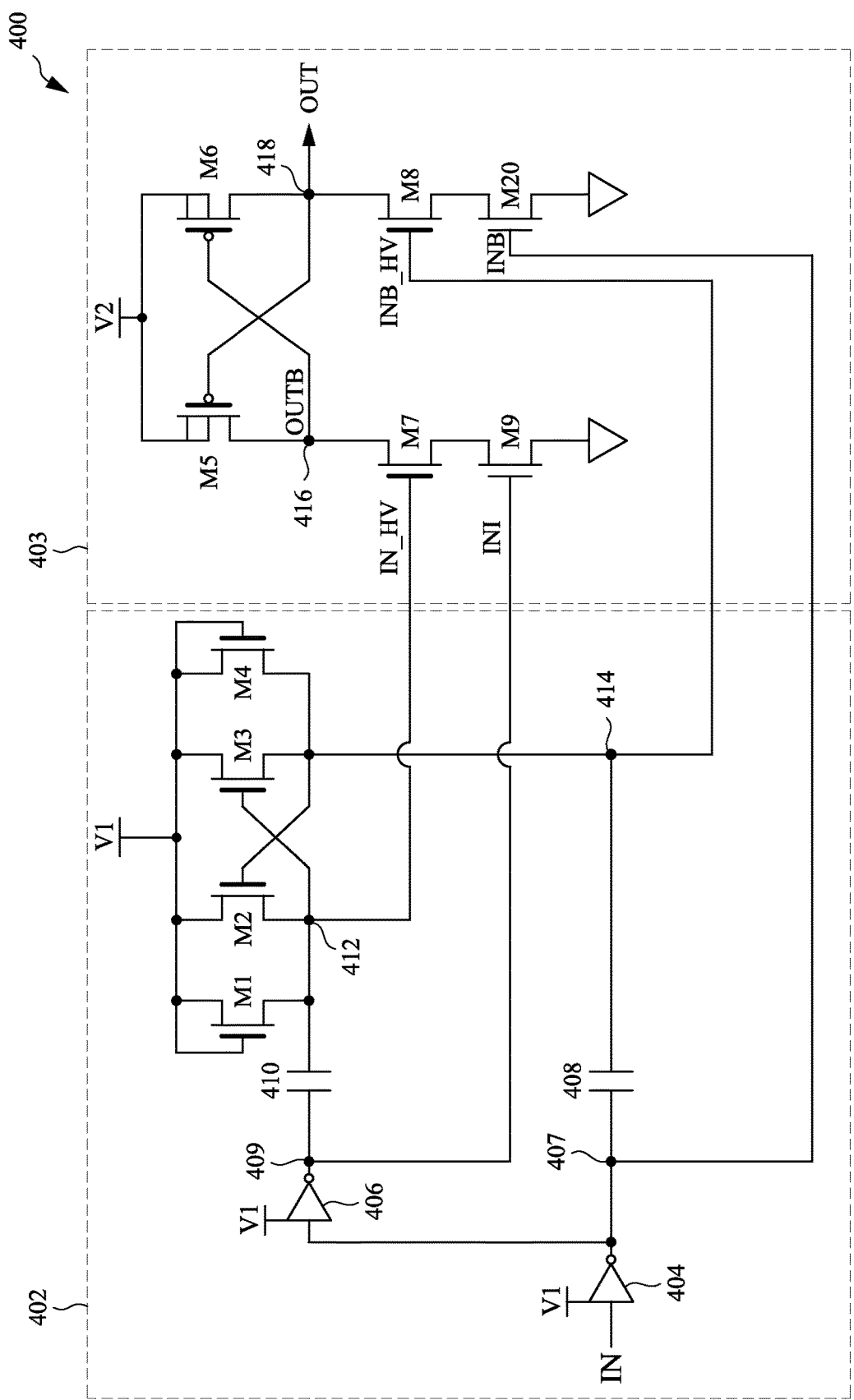
FIG. 4 illustrates a circuit diagram of an example self-protection bias circuit driving transistors of a level shifting circuit, in accordance with some embodiments of the present disclosure.
Figure 5:
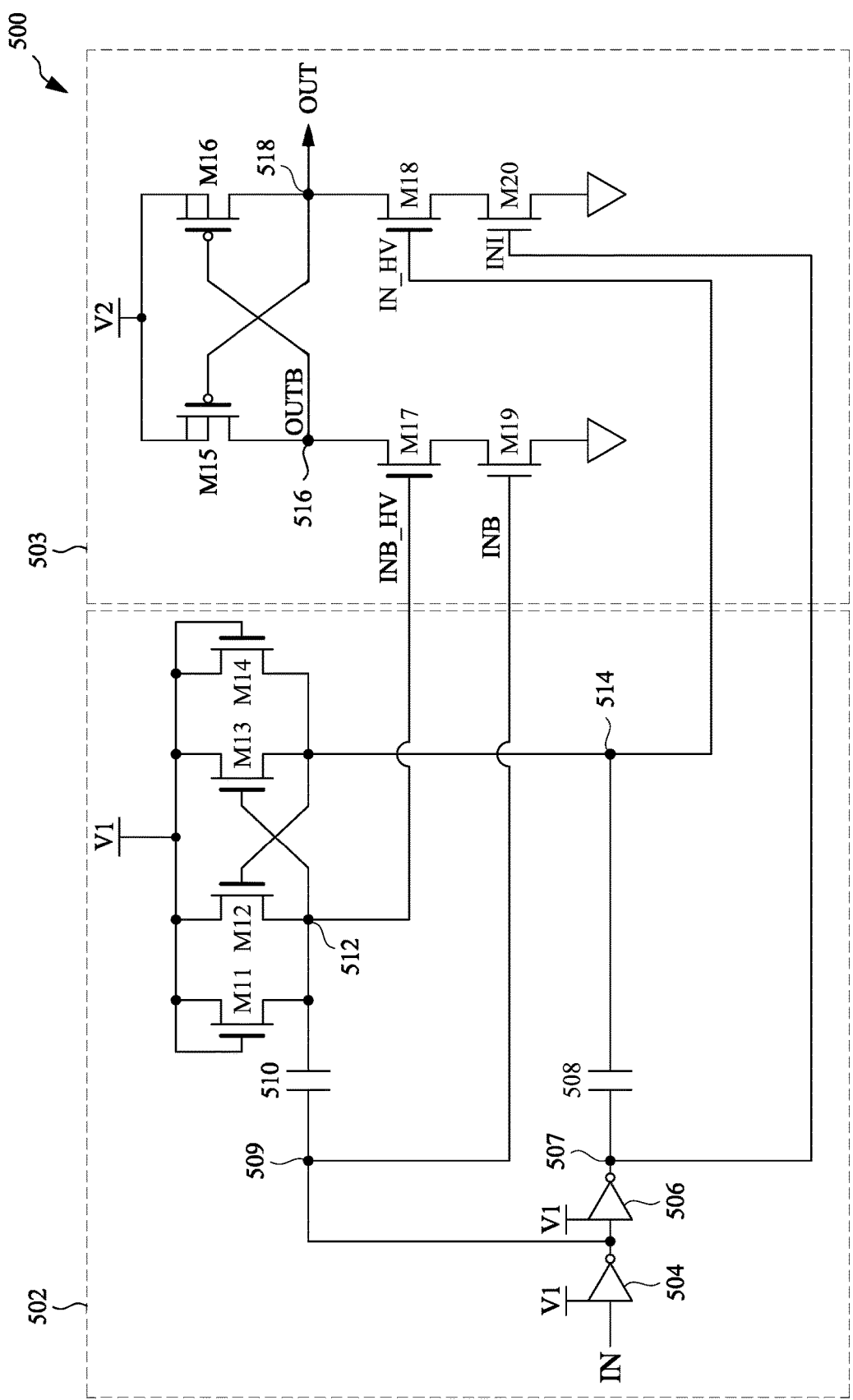
FIG. 5 illustrates a circuit diagram of an example self-protection bias circuit driving transistors of a level shifting circuit that generates a logically inverted output signal, in accordance with some embodiments of the present disclosure.

FIG. 4 illustrates a circuit diagram 400 of an example self-protection bias generator circuit 402 driving transistors of a level shifting circuit 403. The level shifting circuit 403 of the circuit diagram 400 generates an output voltage at the OUT node 418 that has the same logical state as the input signal IN. As shown, the self-protection bias generator circuit 402 includes a first inverter 404 and a second inverter 406. In some implementations, each of the first inverter 404 and the second inverter 406 can include thin-oxide transistors. The self-protection bias generator circuit 402, including the first inverter 404 and the second inverter 406, can be connected to and powered by the supply voltage V1, as shown.

The self-protection bias generator circuit 402 includes transistors M1, M2, M3, and M4. In some implementations, the transistors M1, M2, M3, and M4 each include an nMOSFET. It is appreciated that each of the transistors M1-M4 can include any of various other types of transistors (e.g., bipolar junction transistors, high-electron-mobility transistors, etc.) while remaining within the scope of the present disclosure. The drains of the transistors M1-M4 are electrically coupled with the supply voltage V1. The transistors M1 and M4 are operating as diode-connected transistors, with the respective gates of the transistors M1 and M4 being coupled to the respective drains of the transistors M1 and M4 (e.g., the supply voltage). The transistors M1 and M2 are coupled in parallel, where the respective source of each of the transistors M1 and M2 are electrically coupled to the IN_HV node 412. The transistors M3 and M4 are coupled in parallel, where the respective source of each of the transistors M3 and M4 are electrically coupled to the INB_HV node 414. The gate of the transistor M2 is electrically coupled to the INB_HV node 414, and the gate of the transistor M3 is electrically coupled to the IN_HV node 412. Each of the transistors M1-M4 may be thick-oxide devices.

The self-protection bias generator circuit 402 includes a capacitor 408 and a capacitor 410. One terminal of the capacitor 408 is electrically coupled to an output of the first inverter 404 at the INB node 407, and the other terminal of the capacitor 408 is electrically coupled to the INB_HV node 414. One terminal of the capacitor 410 is electrically coupled to an output of the second inverter 406 at the INI node 409, and the other terminal of the capacitor 410 is electrically coupled to the IN_HV node 412. The transistors M1-M4, along with the capacitors 408 and 410 that are coupled to logically opposite inputs at nodes 407 and 409, respectively, form a voltage doubler circuit, which outputs a voltage up to double the supply voltage V1 at the IN_HV node 412 or the INB_HV node 414 when controlled as described herein.

In an example operation of the self-protection bias generator circuit 402, the input signal IN is provided in an initial logical state. In this example, the first logical state can be a logical low state (e.g., about equal to the ground voltage, or zero volts). The first inverter 404 receives the input signal IN and generates an inverted input signal in the logical high state (e.g., about equal to the supply voltage V1) at the INB node 407. The second inverter 406 receives the inverted input signal in the logical high state, and generates a buffered input signal in the logical low state (e.g., about ground voltage) at the INI node 409. When the INB node 407 is about equal to the supply voltage V1 and the INI node 409 is about equal to the ground voltage, the transistor M2 is turned on and the transistor M3 is turned off. When the transistor M2 is turned on and the INI node 409 has a voltage of about the ground voltage, the capacitor 410 charges to a voltage of about the supply voltage V1.

When the input signal IN transitions to a logical high state from the initial logical low state, the first inverter 404 receives the input signal IN and generates an inverted input signal in the logical low state (e.g., about equal to the ground voltage) at the INB node 407. The second inverter 406 receives the inverted input signal in the logical low state, and generates a buffered input signal in the logical high state (e.g., about the supply voltage V1) at the INI node 409. When the voltage at the INB node 407 is about zero volts, the transistor M2 is turned off. The transistor M1 is in a diode-connected configuration in parallel with the transistor M2, enabling the voltage at the IN_HV node 412 to safely exceed the supply voltage V1. When the voltage at the INI node 409 is driven to the supply voltage V1, the IN_HV node 412 is therefore driven to about twice the supply voltage V1, turning on the transistor M3 and charging the capacitor 408. Because the loads of the IN_HV node 412 are capacitive (e.g., the gates of the transistors M3 and M7), the boosted voltage across the capacitor 410 can be maintained without rapidly discharging (in contrast to a resistive load, for example).

Then, when the input signal IN transitions to a logical low state from the logical high state, first inverter 404 receives the input signal IN and generates an inverted input signal in the logical high state (e.g., about equal to the supply voltage V1) at the INB node 407. The second inverter 406 receives the inverted input signal in the logical high state, and generates a buffered input signal in the logical low state (e.g., about ground voltage) at the INI node 409. When the voltage at the INI node 409 is about zero volts, the transistor M3 is turned off. The transistor M4 is in a diode-connected configuration in parallel with the transistor M3, enabling the voltage at the INB_HV node 414 to safely exceed the supply voltage V1. When the voltage at the INB node 407 is driven to the supply voltage V1, the INB_HV node 414 is therefore driven to about twice the supply voltage V1, turning on the transistor M2 and allowing the capacitor 410 to discharge such that the IN_HV node 412 has a voltage about equal to the supply voltage V1. Because the loads of the INB_HV node 414 are capacitive (e.g., the gates of the transistors M2 and M8), the boosted voltage across the capacitor 408 can be maintained without rapidly discharging (in contrast to a resistive load, for example).

As described herein, the transistors M1 and M4 operate as diode-connected transistors. Due to the configuration of the transistors M1 and M4 at the IN_HV node 412 and the INB_HV node 414, respectively, the threshold voltages ($V_{th}$) of the transistors M1 and M4 can affect the voltage of the IN_HV node 412 and the INB_HV node 414. For example, instead of ranging from the supply voltage V1 to twice the supply voltage V1, the voltage at the IN_HV node 412 may range from the supply voltage V1 less the $V_{th}$ of the transistor M1 to the supply voltage V1 when the input signal IN is in a logical low state, and may range from twice the supply voltage V1 less the $V_{th}$ of the transistor M1 to twice the supply voltage V1 when the input signal IN is in a logical high state. In another example, instead of ranging from the supply voltage V1 to twice the supply voltage V1, the voltage at the INB_HV 414 node may range from the supply voltage V1 less the $V_{th}$ of the transistor M4 to the supply voltage V1 when the input signal IN is in a logical high state, and may range from twice the supply voltage V1 less the $V_{th}$ of the transistor M1 to twice the supply voltage V1 when the input signal IN is in a logical low state.

As shown, each of the INB node 407, the INI node 409, the IN_HV node 412, and the INB_HV node 414 drive gates of the transistors of the level shifter 403. As shown, the level shifter 403 includes transistors M5, M6, M7, M8, M9, and M10. In some implementations, the transistors M5 and M6 each include a pMOSFET, and the transistors M7, M8, M9, and M10 each include an nMOSFET. It is appreciated that each of the transistors M5-M10 can include any of various other types of transistors (e.g., bipolar junction transistors, high-electron-mobility transistors, etc.) while remaining within the scope of the present disclosure. The transistors M5, M6, M7, and M8 may be thick-oxide transistors, and the transistors M9 and M10 may be thin-oxide transistors. The sources of the transistors M5 and M6 are electrically coupled with the second supply voltage V2. The gate of the transistor M5 is connected to the drain of the transistor M6 and the drain of the transistor M8 at the OUT node 418, and the gate of the transistor M6 is connected to the drain of the transistor M5 and the drain of the transistor M7 at the OUTB node 416. The source of the transistor M7 is connected to the drain of the transistor M9, and the source of the transistor M9 is connected to the ground voltage. The source of the transistor M8 is connected to the drain of the transistor M10, and the source of the transistor M8 is connected to the ground voltage.

In this example, the transistors M5 and M6 may be similar to the pull up devices 104 and 106, respectively, of FIG. 1. Furthering this example, the transistors M7 and M8 may be similar to the protection devices 108 and 110 of FIG. 1, respectively, and the transistors M9 and 10 may be similar to the pull down devices 112 and 114 of FIG. 1, respectively. The transistors M5-M10 of the level shifter 403 may operate in a similar manner to the components of the level shifter 100 described in connection with FIG. 1. As shown, the gates of the transistors M7, M8, M9, and M10 receive voltage signals from the self-protection bias generator circuit 402.

In an example operation of the level shifter 403, when the IN_HV node 412 and the INI node 409 are driven to about twice the supply voltage and the supply voltage, respectively (e.g., when the input signal IN is a logical high), both the transistors M7 and M9 can turn on. As described herein, when the input signal IN is a logical high, the INB_HV node 414 and the INB node 407 are driven to about the supply voltage and the ground voltage, respectively, causing both the transistors M8 and M10 to be turned off. When the transistor M7 and the transistor M9 are turned on, the OUTB node 416 is pulled to about the ground voltage, turning on the transistor M6. Because the transistor M8 and the transistor M10 are turned off and not conducting, and the transistor M6 is turned on and conducting, a voltage about equal to the second supply voltage V2 is generated at the output OUT node 418 when the input signal IN is at a logical high state. In the embodiment shown in FIG. 4, the level shifter 403 generates an output voltage at the OUT node 418 that is in the same logical state as the input signal IN.

If the input signal IN is in the logical low state, the self-protection bias generator 402 pulls the INI node 409 to about the ground voltage, and outputs the IN_HV signal at a voltage about equal to V1, as described herein. This causes both the transistors M7 and M9 to turn off. Additionally, the self-protection bias generator 402 generates a logical high voltage about equal to the supply voltage V1 at the INB node 407, and generates about twice the supply voltage V1 at the INB_HV node 414, causing both the transistors M8 and M10 to turn on. When the transistors M8 and M10 turn on, the voltage at the OUT node 418 is pulled to the ground voltage, and the transistor M5 is turned on. Because the transistors M7 and M9 are not conducting, and the transistor M5 is conducting, the voltage at the OUTB node 416 is about equal to the second supply voltage V2. The level shifter 403 therefore generates an output voltage at the OUT node 518 that is in the same logical state as the input signal IN. Details of the voltages of each node described in connection with FIG. 4 in response to different input signals are shown in Table 1 below.

TABLE 1

| Node | Input Signal IN = 0 V | Input Signal IN = V1 |
| --- | --- | --- |
| INI node 409 | 0 V | V1 |
| INB node 407 | V1 | 0 |
| IN_HV node 412 | V1-Vth to V1 | 2*V1-Vth to 2*V1 |
| INB_HV node 414 | 2*V1-Vth to 2*V1 | V1-Vth to V1 |
| OUTB node 416 | V2 | 0 V |
| OUT node 418 | 0 V | V2 |

In Table 1 above, $V_{th}$ corresponds to the $V_{th}$ of the transistors M1 or M4. Although the OUT node 418 is shown as the only output of the level shifter 403, it should be appreciated that, in some embodiments, the OUTB node 416 may itself be utilized as an output that provides the logical inverse of the OUT node 418 at the second supply voltage V2. The OUT node 418 or the OUTB node 416 may provide one or more outputs to one or more circuits that operate at the second supply voltage V2, such as I/O circuits or logical circuits that operate at a voltage level that is greater than the supply voltage V1.

FIG. 5 illustrates a circuit diagram 500 of an example self-protection bias circuit 502 driving transistors of a level shifting circuit 503. The level shifting circuit 503 of the circuit diagram 500 generates an output voltage at the OUT node 518 that has inverse logical state of the input signal IN. The self-protection bias circuit 502 and the level shifting circuit 503 of the circuit diagram 500 may be similar to the self-protection bias circuit 402 and the level shifting circuit 403 of FIG. 4. As shown, the self-protection bias generator circuit 502 includes a first inverter 504 and a second inverter 506. In some implementations, each of the first inverter 504 and the second inverter 506 can include thin-oxide transistors. The self-protection bias generator circuit 502, including the first inverter 504 and the second inverter 506, can be connected to and powered by the supply voltage V1, as shown.

The self-protection bias generator circuit 502 includes transistors M11, M12, M13, and M14. In some implementations, the transistors M11, M12, M13, and M14 each include an nMOSFET. It is appreciated that each of the transistors M11-M14 can include any of various other types of transistors (e.g., bipolar junction transistors, high-electron-mobility transistors, etc.) while remaining within the scope of the present disclosure. The drains of the transistors M11-M14 are electrically coupled with the supply voltage V1. The transistors M11 and M14 are operating as diode-connected transistors, with the respective gates of the transistors M11 and M14 being coupled to the respective drains of the transistors M11 and M14 (e.g., the supply voltage). The transistors M11 and M12 are coupled in parallel, where the respective source of each of the transistors M11 and M12 are electrically coupled to the INB_HV node 512. The transistors M13 and M14 are coupled in parallel, where the respective source of each of the transistors M13 and M14 are electrically coupled to the IN_HV node 514. The gate of the transistor M12 is electrically coupled to the IN_HV node 514, and the gate of the transistor M13 is electrically coupled to the INB_HV node 512. Each of the transistors M11-M14 may be thick-oxide devices.

The self-protection bias generator circuit 502 includes a capacitor 508 and a capacitor 510. One terminal of the capacitor 508 is electrically coupled to an output of the second inverter 506 at the INI node 507, and the other terminal of the capacitor 508 is electrically coupled to the IN_HV node 514. One terminal of the capacitor 510 is electrically coupled to an output of the first inverter 504 at the INB node 509, and the other terminal of the capacitor 510 is electrically coupled to the INB_HV node 512. The transistors M11-M14, along with the capacitors 508 and 510 that are coupled to logically opposite inputs at nodes 507 and 509, respectively, form a voltage doubler circuit, which outputs a voltage up to double the supply voltage V1 at the INB_HV node 512 or the IN_HV node 514 when controlled as described herein.

In an example operation of the self-protection bias generator circuit 502, the input signal IN is provided in an initial logical state. In this example, the first logical state can be a logical low state (e.g., about equal to the ground voltage, or zero volts). The first inverter 504 receives the input signal IN and generates an inverted input signal in the logical high state (e.g., about equal to the supply voltage V1) at the INB node 509. The second inverter 506 receives the inverted input signal in the logical high state, and generates a buffered input signal in the logical low state (e.g., about ground voltage) at the INI node 507. When the INB node 509 is about equal to the supply voltage V1 and the INI node 507 is about equal to the ground voltage, the transistor M13 is turned on and the transistor M12 is turned off. When the transistor M13 is turned on and the INI node 507 has a voltage of about the ground voltage, the capacitor 508 charges to a voltage of about the supply voltage V1.

When the input signal IN transitions to a logical high state from the initial logical low state, the first inverter 504 receives the input signal IN and generates an inverted input signal in the logical low state (e.g., about equal to the ground voltage) at the INB node 509. The second inverter 506 receives the inverted input signal in the logical low state, and generates a buffered input signal in the logical high state (e.g., about the supply voltage V1) at the INI node 507. When the voltage at the INB node 509 is about zero volts, the transistor M13 is turned off. The transistor M14 is in a diode-connected configuration in parallel with the transistor M13, enabling the voltage at the IN_HV node 514 to safely exceed the supply voltage V1. When the voltage at the INI node 507 is driven to the supply voltage V1, the IN_HV node 514 is therefore driven to about twice the supply voltage V1, turning on the transistor M12 and charging the capacitor 510. Because the loads of the IN_HV node 514 are capacitive (e.g., the gates of the transistors M12 and M18), the boosted voltage across the capacitor 508 can be maintained without rapidly discharging (in contrast to a resistive load, for example).

Then, when the input signal IN transitions to a logical low state from the logical high state, first inverter 504 receives the input signal IN and generates an inverted input signal in the logical high state (e.g., about equal to the supply voltage V1) at the INB node 509. The second inverter 506 receives the inverted input signal in the logical high state, and generates a buffered input signal in the logical low state (e.g., about ground voltage) at the INI node 507. When the voltage at the INI node 507 is about zero volts, the transistor M12 is turned off. The transistor M11 is in a diode-connected configuration in parallel with the transistor M12, enabling the voltage at the INB_HV node 512 to safely exceed the supply voltage V1. When the voltage at the INB node 509 is driven to the supply voltage V1, the INB_HV node 512 is therefore driven to about twice the supply voltage V1, turning on the transistor M13 and allowing the capacitor 508 to discharge such that the IN_HV node has a voltage about equal to the supply voltage V1. Because the loads of the INB_HV node 512 are capacitive (e.g., the gates of the transistors M13 and M17), the boosted voltage across the capacitor 510 can be maintained without rapidly discharging (in contrast to a resistive load, for example).

As described herein, the transistors M11 and M14 operate as diode-connected transistors. Due to the configuration of the transistors M11 and M14 at the INB_HV node 512 and the IN_HV node 514, respectively, the $V_{th}$ of the transistors M11 and M14 can affect the voltage of the IN_HV node 512 and the INB_HV node 514. For example, instead of ranging from the supply voltage V1 to twice the supply voltage V1, the voltage at the INB_HV node 512 may range from the supply voltage V1 less the $V_{th}$ of the transistor M11 to the supply voltage V1 when the input signal is in a logical high state, and may range from twice the supply voltage V1 less the $V_{th}$ of the transistor M11 to twice the supply voltage V1 when the input signal is in a logical low state. In another example, instead of ranging from the supply voltage V1 to twice the supply voltage V1, the voltage at the IN_HV node 514 may range from the supply voltage V1 less the $V_{th}$ of the transistor M14 to the supply voltage V1 when the input signal is in a logical low state, and may range from twice the supply voltage V1 less the $V_{th}$ of the transistor M11 to twice the supply voltage V1 when the input signal is in a logical high state.

As shown, each of the INI node 507, the INB node 509, the INB_HV node 512, and the IN_HV node 514 drive gates of the transistors of the level shifter 503. As shown, the level shifter 503 includes transistors M15, M16, M17, M18, M19, and M20. In some implementations, the transistors M15 and M16 each include a pMOSFET, and the transistors M17, M18, M19, and M20 each include an nMOSFET. It is appreciated that each of the transistors M15-M20 can include any of various other types of transistors (e.g., bipolar junction transistors, high-electron-mobility transistors, etc.) while remaining within the scope of the present disclosure. The transistors M15, M16, M17, and M18 may be thick-oxide transistors, and the transistors M19 and M20 may be thin-oxide transistors. The sources of the transistors M15 and M16 are electrically coupled with the second supply voltage V2. The gate of the transistor M15 is connected to the drain of the transistor M16 and the drain of the transistor M18 at the OUT node 518, and the gate of the transistor M16 is connected to the drain of the transistor M15 and the drain of the transistor M17 at the OUTB node 516. The source of the transistor M17 is connected to the drain of the transistor M19, and the source of the transistor M19 is connected to the ground voltage. The source of the transistor M18 is connected to the drain of the transistor M20, and the source of the transistor M18 is connected to the ground voltage.

In this example, the transistors M15 and M16 may be similar to the pull up devices 104 and 106, respectively, of FIG. 1. Furthering this example, the transistors M17 and M18 may be similar to the protection devices 108 and 110 of FIG. 1, respectively, and the transistors M19 and M20 may be similar to the pull down devices 112 and 114 of FIG. 1, respectively. The transistors M15-M20 of the level shifter 503 may operate in a similar manner to the components of the level shifter 100 described in connection with FIG. 1. As shown, the gates of the transistors M17, M18, M19, and M20 receive voltage signals from the self-protection bias generator circuit 502.

In an example operation of the level shifter 503, when the INB_HV node 512 and the INB node 509 are respectively driven to about twice the supply voltage and the supply voltage, respectively (e.g., when the input signal IN is a logical low), both the transistors M17 and M19 can turn on. As described herein, when the input signal IN is a logical low, the IN_HV node 514 and the IN node 507 are driven to about the supply voltage and the ground voltage, respectively, causing both the transistors M18 and M20 to be turned off. When the transistor M17 and the transistor M19 are turned on, the OUTB node 516 is pulled to about the ground voltage, turning on the transistor M16. Because the transistor M18 and the transistor M20 are turned off and not conducting, and the transistor M16 is turned on and conducting, a voltage about equal to the second supply voltage V2 is generated at the output OUT node 518 when the input signal IN is at a logical low state. In the embodiment shown in FIG. 5, the level shifter 503 generates an output voltage at the OUT node 518 that is in the inverse logical state of the input signal IN.

If the input signal IN is in the logical high state, the self-protection bias generator 502 pulls the INB node 509 to about the ground voltage, and outputs the INB_HV signal at a voltage about equal to V1, as described herein. This causes both the transistors M17 and M19 to turn off. Additionally, the self-protection bias generator 502 generates a logical high voltage about equal to the supply voltage V1 at the INI node 507, and generates about twice the supply voltage V1 at the IN_HV node 514, causing both the transistors M18 and M20 to turn on. When the transistors M18 and M20 turn on, the voltage at the OUT node 518 is pulled to the ground voltage, and the transistor M15 is turned on. Because the transistors M17 and M19 are not conducting, and the transistor M15 is conducting, the voltage at the OUTB node 516 is about equal to the second supply voltage V2. The level shifter 503 therefore generates an output voltage at the OUT node 518 that is in the inverse logical state of the input signal IN. Details of the voltages of each node described in connection with FIG. 5 in response to different input signals are shown in Table 2 below.

TABLE 2

| Node | Input Signal IN = 0 V | Input Signal IN = V1 |
| --- | --- | --- |
| INI node 507 | 0 V | V1 |
| INB node 509 | V1 | 0 |
| IN_HV node 514 | 2*V1-Vth to 2*V1 | V1-Vth to V1 |
| INB_HV node 512 | V1-Vth to V1 | 2*V1-Vth to 2*V1 |
| OUTB node 516 | 0 V | V2 |
| OUT node 518 | V2 | 0 V |

In Table 2 above, $V_{th}$ corresponds to the $V_{th}$ of the transistors M11 or M14. Although the OUT node 518 is shown as the only output of the level shifter 503, it should be appreciated that, in some embodiments, the OUTB node 516 may itself be utilized as an output that provides the logical inverse of the OUT node 518 at the second supply voltage V2. The OUT node 518 or the OUTB node 516 may provide one or more outputs to one or more circuits that operate at the second supply voltage V2, such as I/O circuits or logical circuits that operate at a voltage level that is greater than the supply voltage V1.

Figure 6:
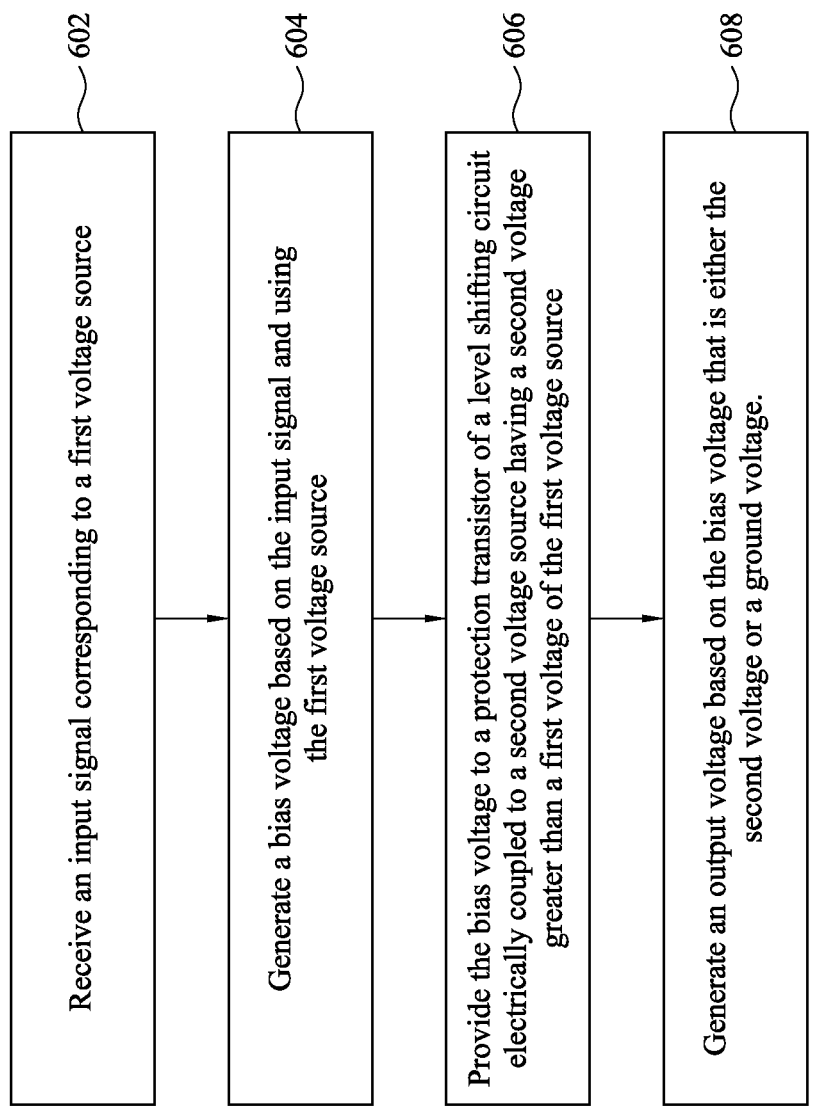
FIG. 6 illustrates a flowchart of an example method to operate the disclosed level shifter with the self-protection bias circuit, in accordance with some embodiments of the present disclosure.

FIG. 6 illustrates a flowchart of an example method 600 to operate the disclosed voltage provision circuit, in accordance with some embodiments of the present disclosure. The method 600 may be used to operate a level shifting device (e.g., the level shifting device 100, the circuit 400, the circuit 500, etc.) that includes a self-protecting bias generator (e.g., the self-protecting bias generator 102, the self-protecting bias generator 402, the self-protecting bias generator 502, etc.). For example, at least some of the operations described in the method 600 use layouts and schematics described in FIGS. 1-5. It is noted that the method 600 is merely an example and is not intended to limit the present disclosure. Accordingly, it is understood that additional operations may be provided before, during, and after the method 600 of FIG. 6, and that some other operations may only be briefly described herein.

In brief overview, the method 600 starts with operation 602 of receiving an input signal corresponding to a first voltage source. The method 600 proceeds to operation 604 of generating a bias voltage based on the input signal and using the first voltage source. The method 600 proceeds to operation 606 of providing the bias voltage to a protection transistor of a level shifting circuit electrically coupled to a second voltage source having a second voltage, where the second voltage is greater than a first voltage of the first voltage source. The method 600 proceeds to operation 608 of generating an output voltage based on the bias voltage that is either the second voltage or a ground voltage.

Referring to operation 602, an input signal (e.g., the input signal IN described herein) corresponding to a first voltage source (e.g., the supply voltage V1) is received. The input signal may be provided via one or more logical circuits, and received by a self-protection bias generator (e.g., the self-protecting bias generator 102, the self-protecting bias generator 402, the self-protecting bias generator 502, etc.), as described herein. In an embodiment, the input signal may be received by an inverter of the self-protection bias generator.

Referring to operation 604, a bias voltage (e.g., the voltage V3 shown in FIGS. 2 and 3, etc.) is generated based on the input signal and using the first voltage source. The bias voltage may be generated by the self-protection bias generator to drive one or more thick-oxide transistors of a level shifting circuit (e.g., the level shifting circuit 100, the level shifting circuit 403, the level shifting circuit 503, etc.). In an embodiment, the self-protection bias generator can generate a second bias voltage based on the input signal and using the first voltage source, for example, when the input signal changes from a first logical state to a second logical state.

Referring to operation 606, the bias voltage can be provided to a protection transistor (e.g., a thick-oxide transistor) of a level shifting circuit (e.g., the level shifting circuit 100). The level shifting circuit can be electrically coupled to a second voltage source (e.g., V2) that is greater than the first voltage source (e.g., V1). The bias voltage (e.g., IN_HV) can be provided to a gate of the protection transistor (e.g., the first protection device 108) to drive the protection transistor. In an embodiment where a second bias voltage (e.g., INB_HV) is generated when input signal changes from the first logical state to the second logical state, a second bias voltage can be provided to a second protection transistor (e.g., the second protection device 110) of the level shifting circuit, as described herein.

Referring to operation 608, an output voltage (e.g., a voltage at the OUT node 118, 418 or 518, a voltage at the OUTB node 116, 416 or 516, etc.) can be generated based on the bias voltage that is either the voltage of the second voltage source or a ground voltage. The bias voltage can control the transistors (e.g., the first pull down device 112, the second pull down device 114, etc.) of the level shifting circuit to cause the level shifting circuit to generate (e.g., at the output node 118) a logical high output (e.g., the voltage of the second voltage source) or a logical low output (e.g., the ground voltage).

In one aspect of the present disclosure, a semiconductor device is disclosed. The semiconductor includes a level shifting circuit configured to generate an output voltage in a second voltage domain corresponding to an input signal in a first voltage domain. The level shifting circuit includes a thick-oxide transistor and a thin-oxide transistor. The semiconductor device includes a bias generating circuit operatively coupled to the level shifting circuit and configured to generate a bias voltage substantially higher than a voltage than the input signal, and provide the bias voltage to a gate of the thick-oxide transistor, causing the level shifting circuit to generate the output voltage.

In another aspect of the present disclosure, a circuit is disclosed. The circuit includes a first capacitor having a first terminal coupled to a first signal. The circuit includes a second capacitor having a first terminal coupled to a source of a logical inversion of the first signal. The circuit includes a first NMOS transistor and a second NMOS transistor. The first NMOS transistor is gated with a source voltage of the second NMOS transistor. The second NMOS transistor is gated with a source voltage of the first NMOS transistor. The first NMOS transistor and the second NMOS transistor are drained with a supply voltage. The circuit includes a third NMOS transistor and a fourth NMOS transistor each gated with and drained with the supply voltage. Each of the first and third NMOS transistors is sourced with a voltage at a second terminal of the first capacitor. Each of the second and fourth NMOS transistors is sourced with a voltage at a second terminal of the second capacitor. The circuit generates a bias output voltage at the second terminal of the second capacitor or at the second terminal of the first capacitor in response to the first signal being in a first logic state. The bias output voltage is greater than the supply voltage.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a level shifting circuit configured to generate an output voltage in a second voltage domain corresponding to an input signal in a first voltage domain, wherein the level shifting circuit comprises at least a thick-oxide transistor and a thin-oxide transistor;
a bias generating circuit comprising a capacitor and a pair of cross-coupled NMOS transistors, wherein a first terminal of the capacitor is coupled to a node of the pair of cross-coupled NMOS transistors and a second terminal of the capacitor is coupled to a gate of the thin-oxide transistor, and wherein the bias generating circuit is operatively coupled to the level shifting circuit and configured to:
generate, at the first terminal of the capacitor, a bias voltage substantially higher than a voltage of the input signal; and
provide the bias voltage to a gate of the thick-oxide transistor, causing the level shifting circuit to generate the output voltage.

2. The semiconductor device of claim 1, wherein a first terminal of the thin-oxide transistor is electrically coupled to ground and a second terminal of the thin-oxide transistor is electrically coupled to a first terminal of the thick-oxide transistor.

3. The semiconductor device of claim 1, wherein the thick-oxide transistor has a greater threshold voltage than the thin-oxide transistor.

4. The semiconductor device of claim 1, wherein the gate of the thick-oxide transistor and a gate of the thin-oxide transistor are electrically coupled respectively to the bias generating circuit via the first terminal of the capacitor and the second terminal of the capacitor.

5. The semiconductor device of claim 1, wherein the bias generating circuit is electrically coupled to a first voltage source of the first voltage domain, and the level shifting circuit is electrically coupled to a second voltage source of the second voltage domain.

6. The semiconductor device of claim 1, wherein the level shifting circuit is configured generate the output voltage in the second voltage domain proportional to the input signal.

7. The semiconductor device of claim 1, wherein the level shifting circuit is configured generate the output voltage in the second voltage domain proportional to a logical inverse of the input signal.

8. The semiconductor device of claim 1, wherein the bias generating circuit comprises a plurality of inverters.

9. The semiconductor device of claim 1, wherein:
the level shifting circuit further comprises a second thick-oxide transistor and a second thin-oxide transistor; and
the bias generating circuit generates a second bias voltage.

10. A circuit, comprising:
a first capacitor having a first terminal coupled to a first signal;
a second capacitor having a first terminal coupled to a source of a logical inversion of the first signal;
a first NMOS transistor and a second NMOS transistor, the first NMOS transistor gated with a source voltage of the second NMOS transistor, the second NMOS transistor gated with a source voltage of the first NMOS transistor, the first NMOS transistor and the second NMOS transistor drained with a supply voltage;
a third NMOS transistor and a fourth NMOS transistor each gated with and drained with the supply voltage, each of the first and third NMOS transistors sourced with a voltage at a second terminal of the first capacitor, each of the second and fourth NMOS transistors sourced with a voltage at a second terminal of the second capacitor, wherein the circuit generates a bias output voltage at the second terminal of the second capacitor or at the second terminal of the first capacitor in response to the first signal being in a first logic state; and
a level shifter comprising a first PMOS transistor and a second PMOS transistor, the first PMOS transistor and the second PMOS transistor sourced with a second supply voltage greater than the supply voltage, the first PMOS transistor gated with a drain voltage of the second PMOS transistor, the second PMOS transistor gated with a drain voltage of the first PMOS transistor.

11. The circuit of claim 10, wherein the circuit generates a second bias output voltage at the second terminal of the first capacitor.

12. The circuit of claim 10, wherein the level shifter further comprises:
a fifth NMOS transistor drained by the drain voltage of the first PMOS transistor;
a sixth NMOS transistor drained by a source voltage of the fifth NMOS transistor and sourced by a ground voltage;
a seventh NMOS transistor drained by the drain voltage of the second PMOS transistor; and
an eighth NMOS transistor drained by a source voltage of the seventh NMOS transistor and sourced by the ground voltage.

13. The circuit of claim 12, wherein:
the fifth NMOS transistor is gated with the bias output voltage at the second terminal of the second capacitor; and
the sixth NMOS transistor is gated with the logical inversion of the first signal.

14. The circuit of claim 13, wherein the drain voltage of the seventh NMOS transistor provides the supply voltage in a logical state that matches the logical inversion of the first signal.

15. The circuit of claim 12, wherein:
the circuit generates the bias output voltage at the second terminal of the first capacitor;
the seventh NMOS transistor is gated with the bias output voltage at the second terminal of the first capacitor; and
the eighth NMOS transistor is gated with the same logic state of the first signal.

16. The circuit of claim 15, wherein the drain voltage of the seventh NMOS transistor provides the second supply voltage in a logical state that matches a logical state of the first signal.

17. The circuit of claim 10, further comprising:
a first inverter that receives an input signal and generates the first signal; and
a second inverter that receives the first signal and generates the logical inversion of the first signal.

18. A method, comprising:
receiving an input signal corresponding to a first voltage source;
generating, at a first terminal of a capacitor coupled to a node of a pair of cross-coupled NMOS transistors, a bias voltage based on the input signal and using the first voltage source;
providing the bias voltage to a protection transistor of a level shifting circuit electrically coupled to a second voltage source having a second voltage, the second voltage greater than a first voltage of the first voltage source;
providing the input signal to a second transistor in series with the protection transistor, the second transistor coupled to a second terminal of the capacitor; and
generating an output voltage based on the bias voltage that is either the second voltage or a ground voltage.

19. The method of claim 18, further comprising:
generating a second bias voltage based on the input signal and using the first voltage source; and
providing the second bias voltage to a second protection transistor of the level shifting circuit.

* * * * *